United States Patent
Chester

[11] Patent Number: 6,023,176
[45] Date of Patent: Feb. 8, 2000

[54] INPUT BUFFER

[75] Inventor: Anthony J. Chester, Camberley, United Kingdom

[73] Assignee: Cypress Semiconductor Corp., San Jose, Calif.

[21] Appl. No.: 09/049,823

[22] Filed: Mar. 27, 1998

[51] Int. Cl.[7] .................................................. H03B 1/00
[52] U.S. Cl. .............................. 327/112; 326/87; 327/535
[58] Field of Search .................................. 326/85, 87, 91; 327/108, 109, 110, 111, 112, 525, 535, 537, 540, 541

[56] References Cited

U.S. PATENT DOCUMENTS

| | | | |
|---|---|---|---|
| 4,719,369 | 1/1988 | Asano et al. | 307/443 |
| 4,791,323 | 12/1988 | Austin | 307/475 |
| 4,797,580 | 1/1989 | Sunter | 307/451 |
| 4,823,070 | 4/1989 | Nelson | 323/285 |
| 4,857,763 | 8/1989 | Sakurai et al. | 307/443 |
| 4,877,978 | 10/1989 | Platt | 307/473 |
| 4,978,905 | 12/1990 | Hoff et al. | 323/314 |
| 5,095,230 | 3/1992 | Takai et al. | 307/451 |
| 5,132,555 | 7/1992 | Takahashi | 307/296.1 |
| 5,136,182 | 8/1992 | Fawal | 307/296.8 |
| 5,153,450 | 10/1992 | Ruetz | 307/443 |
| 5,297,097 | 3/1994 | Etoh et al. | 365/226 |
| 5,305,282 | 4/1994 | Choi | 365/230.08 |
| 5,321,653 | 6/1994 | Suh et al. | 365/189.09 |
| 5,355,033 | 10/1994 | Jang | 307/475 |
| 5,361,003 | 11/1994 | Roberts | 326/21 |
| 5,386,153 | 1/1995 | Voss et al. | 326/34 |
| 5,408,191 | 4/1995 | Han et al. | 326/33 |
| 5,444,406 | 8/1995 | Horne | 327/277 |
| 5,451,896 | 9/1995 | Mori | 327/543 |
| 5,481,179 | 1/1996 | Keeth | 323/315 |
| 5,489,858 | 2/1996 | Pierce et al. | 326/56 |
| 5,525,933 | 6/1996 | Matsuki et al. | 327/309 |
| 5,528,129 | 6/1996 | Kaneko et al. | 323/313 |
| 5,552,723 | 9/1996 | Shigehara et al. | 326/86 |
| 5,554,942 | 9/1996 | Herr et al. | 326/33 |
| 5,557,232 | 9/1996 | Shimogawa | 327/545 |
| 5,563,526 | 10/1996 | Hastings et al. | 326/37 |
| 5,583,457 | 12/1996 | Horiguchi et al. | 326/121 |
| 5,589,783 | 12/1996 | Mc Clure | 326/71 |
| 5,600,271 | 2/1997 | Erickson et al. | 327/108 |
| 5,610,550 | 3/1997 | Furutani | 327/543 |
| 5,625,302 | 4/1997 | Covino et al. | 326/93 |
| 5,644,254 | 7/1997 | Boudry | 326/62 |
| 5,668,483 | 9/1997 | Roohparvar | 326/34 |
| 5,732,027 | 3/1998 | Arcoleo et al. | 365/189.05 |
| 5,848,014 | 12/1998 | Yukshing | 365/227 |
| 5,877,638 | 3/1999 | Lin | 327/108 |

FOREIGN PATENT DOCUMENTS 0315473  5/1989  European Pat. Off. ..... H03K 19/094

*Primary Examiner*—Jeffrey Zweizig
*Attorney, Agent, or Firm*—Christopher P. Maiorana, P.C.

[57] ABSTRACT

An input buffer is provided which can function as either a voltage referenced input buffer or a non-voltage referenced input buffer. The input buffer includes a circuit which is selectively configurable in one of the two different modes of operation in response to a mode signal, wherein in a first mode of operation a reference signal is operative to constrain a trip point of the input buffer. A single circuit with a capability of fulfilling both roles allows the decision as to which mode of input buffer is to be used to be deferred until it has been determined which mode is most suitable for a particular application.

21 Claims, 4 Drawing Sheets

INPUT BUFFER

FIELD OF THE INVENTION

The present invention relates to an input buffer for use in an integrated circuit such as a semiconductor memory device and in particular, to an input buffer which is electrically switchable between different modes of operation.

BACKGROUND TO THE INVENTION

Input buffers often use a CMOS inverter. An example of a conventional inverter gate type input buffer is shown in FIG. 1. A nominal supply voltage is used at the input stage. The trip point of the input buffer depends on the supply voltage as well as temperature and process skew. Variations in the supply voltage, temperature or process skew can increase the trip point which can result in an increase in the propagation delay on the input signal rising edge and a decrease in the propagation delay on the input signal falling edge. If the signal has to be clocked into a register, this variation in propagation delay will affect the set up and hold times to the register. In particular if the propagation delay is increased the register will take longer to set up. Higher frequency applications typically have to meet tighter set up and hold specifications than lower frequency applications. For example, this is true for cache RAM which must meet increasingly tighter set up and hold specifications for the latest microprocessor applications.

One proposed solution is to provide a reference voltage to stabilize the trip point of the input buffer so that it is not sensitive to variations in supply voltage, temperature or process skew. An example of a suitable circuit is shown in FIG. 2. A CMOS reference voltage source (not shown) is used which is designed to reject variations in the supply voltage (Vcc), temperature and process skew. The reference voltage source generates a reference voltage (Vref) which is supplied to a reference branch of the input buffer, as will be described in detail below.

The voltage referenced input buffer comprises an input branch 21 and a reference branch 22. Transistor 23 and transistor 24 of the reference branch 22 form an inverter with its input voltage fixed by the reference voltage Vref. Transistor 25 is diode connected and derives a control signal for a PMOS transistor 26 within the input branch 21. By design, transistor 23 and transistor 24 of the reference branch 22 are kept in the saturated region throughout the range of the supply voltage. This ensures that the reference branch trip point is determined solely by the reference voltage. The current in the input branch 21 is set by a loop consisting of transistor 23, transistor 25, transistor 26 and transistor 27 to be a scaled-up copy of the current in the reference branch 22, provided the input voltage equals the reference voltage. The circuit's symmetry ensures that transistor 27 and transistor 28 within the input branch 21 also operate in the saturated region, just like the corresponding components transistor 23 and transistor 24 within the reference branch 22. Accordingly, the trip point of the input branch 21 is constrained by the reference voltage, irrespective of changes in the supply voltage. The output of the input branch is drawn from a node between PMOS transistor 26 and NMOS transistor 28. This configuration can be seen as a differential-type input stage which compares the supply voltage with a reference voltage and rejects undesirable variations in the supply voltage.

The main benefit of such an input buffer is that it provides a stable trip point, thus allowing set up and hold specifications to be met with better margins. However, the voltage reference generator associated with such an input buffer draws a large standby current ($I_{sb}$), which is undesirable.

Our co-pending U.S. patent application with Ser. No. 08/874,006, now U.S. Pat. No. 5,848,014, the contents of which which are incorporated herein by reference, discloses a controllable sleep/power-down mode for a input buffer. This enables an input buffer to exist in a state in which it draws no standby current when it is not reading or writing data from or into a memory device.

SUMMARY OF THE INVENTION

According to a first aspect of the present invention an input buffer comprises a circuit selectively configurable in one of two different modes of operation in response to a mode signal, wherein in a first mode of operation a reference signal is operative to constrain a trip point of the input buffer.

According to a second aspect of the present invention, a semiconductor device comprises an input buffer according to the first aspect of the present invention, in combination with a mode signal source for generating a mode signal, the output of the mode signal source being coupled to the input buffer to determine the mode of operation of the input buffer.

According to a third aspect of the present invention, there is provided a method of determining an operational mode of an input buffer, comprising the steps of:

applying a mode signal and a reference signal to the input buffer to configure the input buffer in a first mode of operation;

testing the operation of the circuit to obtain a test result; and, configuring the input buffer in one of at least two different operational modes in response to the test result.

The operational mode decision (e.g. whether a voltage referenced input buffer or a non-voltage referenced input buffer) depends substantially on the applications in which that buffer will be used. A single circuit with the capability of fulfilling both roles allows the operational mode decision to be deferred until it has been determined which mode is most suitable for the particular application. Furthermore, for a manufacturer, it is convenient and cost effective to have a single production line that can manufacture a semiconductor device which at the outset includes one or more input buffers which may function as either a voltage referenced input buffer or a non-voltage referenced input buffer.

BRIEF DESCRIPTION OF THE DRAWINGS

Examples of the present invention will now be described in detail with reference to the accompanying drawings, in which.

DETAILED DESCRIPTION

Figure 3:
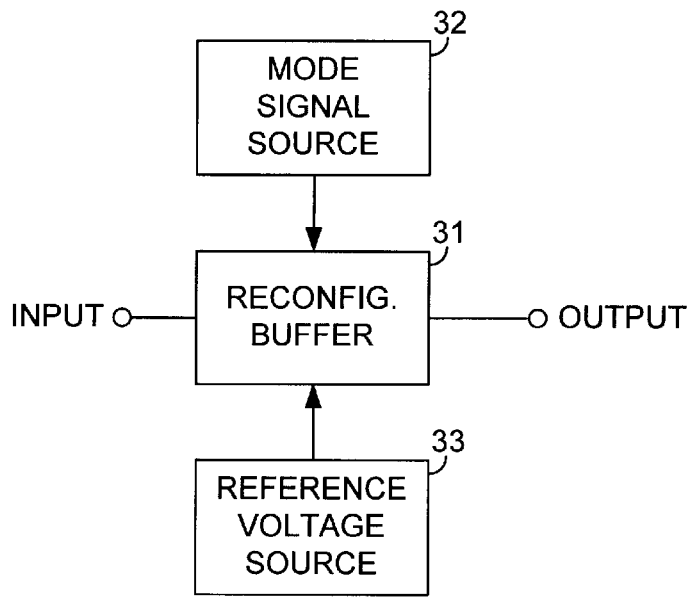
FIG. 3 shows a schematic block diagram of the present invention.

FIG. 3 shows a block diagram of an example of an input buffer in accordance with the present invention. The input buffer has a selectively reconfigurable buffer circuit 31, a mode signal source 32, and a reference voltage source 33. As will be described in detail below, the input buffer may be configured as a voltage referenced input buffer or a non-voltage referenced input buffer, and the particular configuration of the circuit is determined by the respective outputs of the reference voltage source 33 and the mode signal source 32. Additional operational modes (e.g., a test mode, a disabled mode, a power-down mode, etc.) may also be possible. Circuitry for such additional operational modes is conventional and can be implemented in accordance with techniques known to those of ordinary skill in the art.

In a voltage referenced mode, a reference voltage signal REF1 generated by the reference voltage source 33 is applied to the buffer circuit 31. This signal has the effect of constraining a trip point of the buffer circuit 31. To maintain the buffer circuit 31 in a mode of operation which is properly responsive to the reference voltage signal a predetermined mode signal is simultaneously applied to the buffer circuit 31 from the mode signal source 32. In contrast, in a non-voltage referenced mode, the output REF1 of the reference voltage source 33 is disabled so that no reference voltage is applied to the buffer circuit 31. As will be described in detail below, to counteract some potential undesirable effects of this on the trip point of the buffer circuit 31, a different predetermined mode signal is applied thereto.

Figure 4:
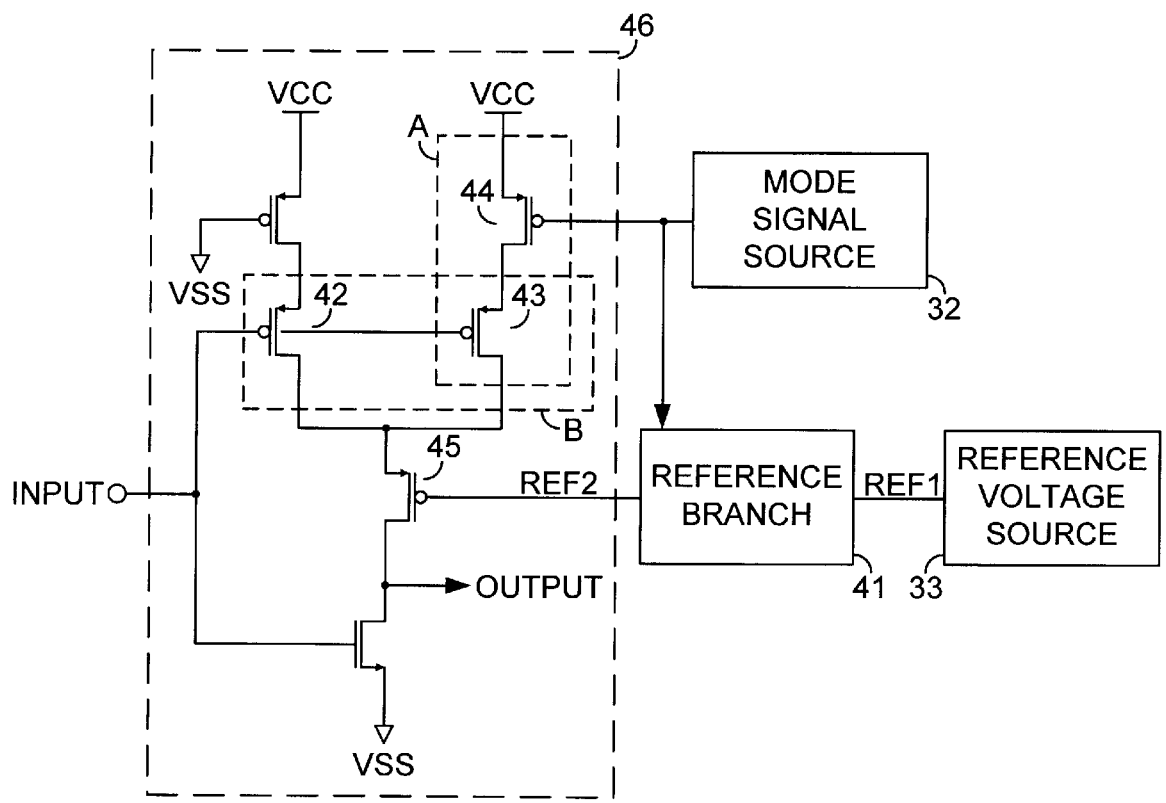
FIG. 4 shows a simplified circuit diagram of one example of the present invention.

FIG. 4 shows a simplified circuit diagram of an example of an input buffer in accordance with the present invention. For clarity, the input buffer has been drawn with the mode signal source 32 and the reference voltage source 33 represented schematically. Also, a reference branch circuit 41, identical to that shown in and described with reference to the input buffer in FIG. 2 is only represented schematically.

Figure 2:
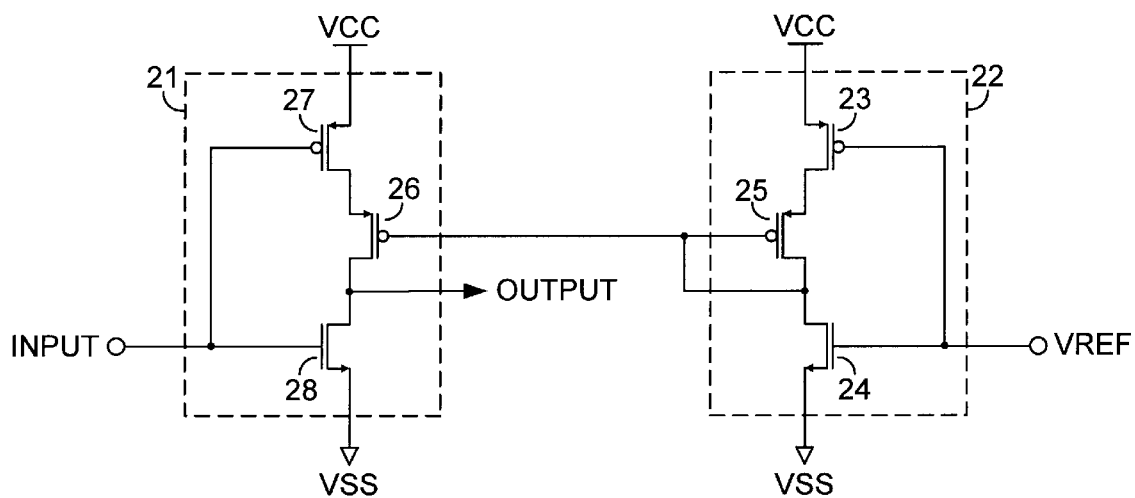
FIG. 2 shows a simplified circuit diagram of a conventional voltage referenced type input buffer.

The circuit may be configured in a similar way to the circuit shown in FIG. 2, but with a number of modifications. Firstly, it can be seen that the PMOS pull-up transistor 27 from FIG. 2, has been split into two narrower PMOS transistors 42 and 43 connected in parallel within the input branch 46. A further PMOS transistor 44 is provided in series between transistor 43 and the positive supply rail Vcc. As will be described in detail below, transistor 44 may function as an isolation transistor in the selective configuration of the circuit.

The circuit can operate as a voltage referenced input buffer with the benefit of a stabilized trip point, or it can operate as a non-voltage-referenced input buffer. When the device is first manufactured it has the capability of acting in either mode. The permanent fixation of the circuit in one specific mode before the device is shipped to a customer determines in which mode of operation the buffer will subsequently operate.

When operated in a voltage referenced mode, a reference signal REF2 from the reference branch 41 is applied to the gate of PMOS transistor 45. A mode signal (Vmode) from the mode signal source 32 is set at logic low and therefore transistor 44 is turned on so that the PMOS transistor 43 within transistor group A is functional. This means that the size of the pull-up component indicated by transistor group B will be the resultant of the sum of the two transistors 42 and 43, and therefore of a size equivalent to pull-up transistor 27 in FIG. 2. Accordingly, the circuit will act as a voltage referenced input buffer as described earlier with reference to FIG. 2. Again, the PMOS transistor 45 acts to constrain the input buffer trip point to a value determined by the output of the reference branch 41.

Figure 1:
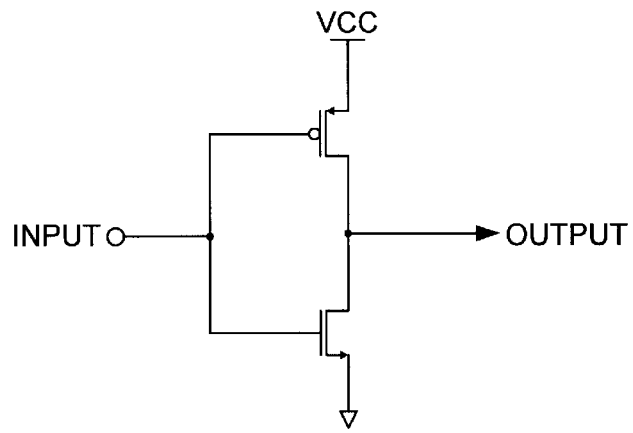
FIG. 1 shows a simplified circuit diagram of a conventional inverter type input buffer.

In contrast, if the non-voltage-referenced mode is required, the output REF2 of the voltage reference branch 41 is set to logic low. This is done by the application of the mode signal through some combinational logic within reference branch 41. Accordingly, in this mode of operation the reference signal REF2 applied to the gate of transistor 45 is logic low and therefore it will be driven hard on, causing transistor 42 and transistor 43 to have a greater drive strength. This increased drive strength has the effect of increasing the trip point to the required level, the effective size of the pull-up component in transistor group B must be reduced. This is achieved by setting the mode signal at logic high so that transistor 44 is turned off, thus isolating transistor 43 from the positive supply rail. This effectively removes transistor 43 from the circuit and reduces the size of the pull-up component in the input branch 46 to the size of single transistor 42. Pull-up transistor 42 has increased drive strength and therefore can act as if it were a single transistor with a size equivalent to the combined size of the pull-up component in group B acting only at regular drive strength. Thus, the trip point of the input buffer is maintained at the required level and the circuit operates in a similar manner to the conventional non-voltage referenced input buffer described earlier with reference to FIG. 1. Also, because the voltage reference source has been turned off in this mode, none of the problems associated with stand-by currents arise.

The operation of the circuit is dependent on the inclusion or isolation of PMOS transistor 43, which is achieved by switching PMOS transistor 44 on or off using the mode signal. The inclusion of PMOS transistor 42 allows the circuit to function as a voltage referenced input buffer whilst its isolation allows the circuit to function as a non-voltage-referenced input buffer.

Figure 5:
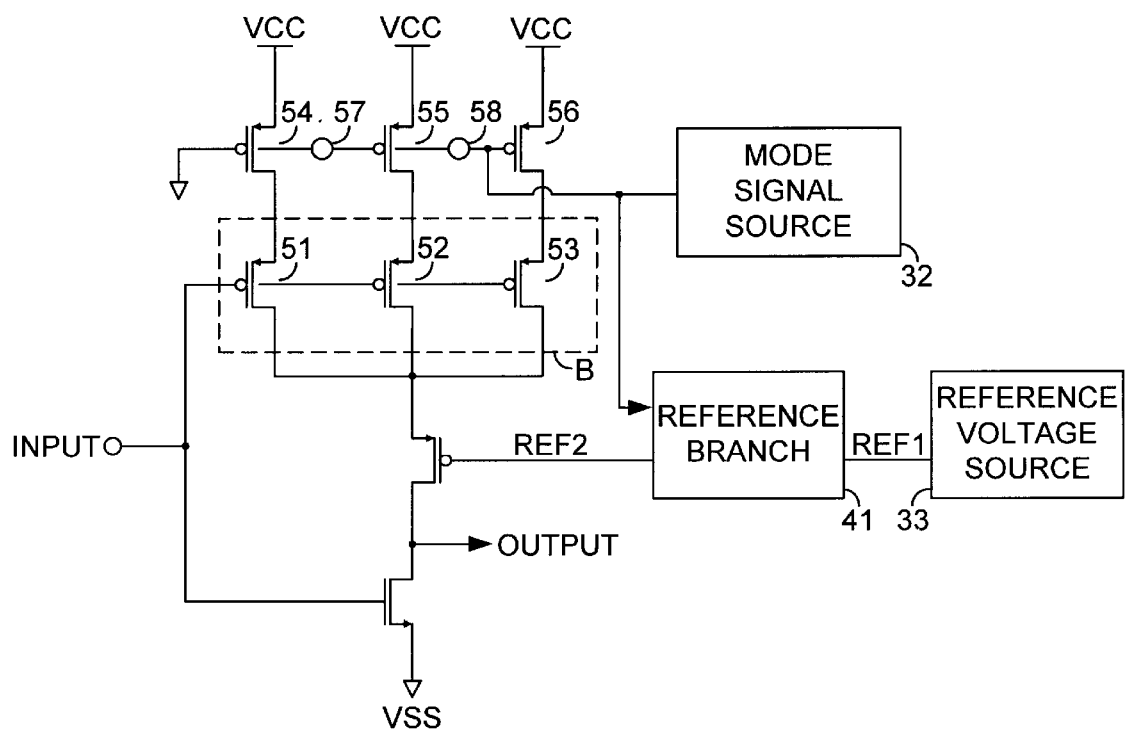
FIG. 5 shows a simplified circuit diagram of another example of the present invention.

FIG. 5 shows a simplified circuit diagram of another example of an input buffer in accordance with the present invention. Again for clarity, the input buffer has been drawn with the mode signal source 32 and the reference voltage source 33 represented schematically. Also, a reference branch 41, identical to that shown in and described with reference to the input buffer in FIG. 2 is represented schematically. In this example, PMOS pull-up transistor 27 from FIG. 2 has been split into three narrower PMOS transistors 51, 52, 53 connected in parallel. Further PMOS transistors 54, 55, 56 are provided respectively connected in series between PMOS transistors 51, 52, 53 and the positive supply rail Vcc. A first metal option 57 is provided between the gates of PMOS transistors 54 and 55, and a second metal option 58 is provided between the gates of PMOS transistors 55 and 56.

When metal option 57 is filled in and metal option 58 is not filled in, the gates of PMOS transistors 54 and 55 are connected to ground. There is no connection between PMOS transistors 55 and 56 so that the Vmode signal is only applied to the gate of PMOS transistor 56. PMOS transistor 51 and PMOS transistor 52 act as a single PMOS transistor equal in size to the sum of the sizes of the individual components. The circuit operates in a similar way to the circuit shown in FIG. 4, with the combination of components 51 and 52 corresponding to PMOS transistor 42 in FIG. 4.

When metal option 58 is filled in and metal option 57 is not filled in, PMOS transistors 55 and 56 act as a single PMOS transistor with a size equal to the sum of the sizes of individual PMOS transistors 55 and 56. The Vmode signal is applied to the gates of each of these PMOS transistors. PMOS transistor 52 and PMOS transistor 53 act as a single PMOS transistor equal in size to the sum of the sizes of the individual components. The circuit operates in a similar way to the circuit shown in FIG. 4, with the combination of components 55 and 56 corresponding to PMOS transistor 44 in FIG. 4.

The provision of metal options allows the potential fraction of the pull-up component B which is to be isolated in response to the Vmode signal in a non-referenced mode to be selected. The size of the pull-up unit B directly affects the trip point of the input buffer when it is operating in a non-voltage-referenced mode, as is described above. In FIG. 4, when PMOS transistor 43 is isolated from the circuit, the size of pull-up unit B is halved which compensates for its increased drive strength. The modification shown in FIG. 5 allows the size of the pull-up unit B to be cut by one third or two thirds, depending upon the state of the metal options. Any fraction is possible depending on the number of stacks of transistors in the input branch of the input buffer.

This modification to the circuit allows the input buffer to be matched for a particular application where the trip point is critical. The input buffer can be tested first with metal option 57 filled in (and metal option 58 not filled in), and then with metal option 58 filled in (and metal option 57 not filled in) to identify the most appropriate combination. This is useful, for example, where the circuit needs to be configured for use with a specific microprocessor, since there can be variation in required trip point dependent on the particular make and model of the microprocessor.

Figure 6:
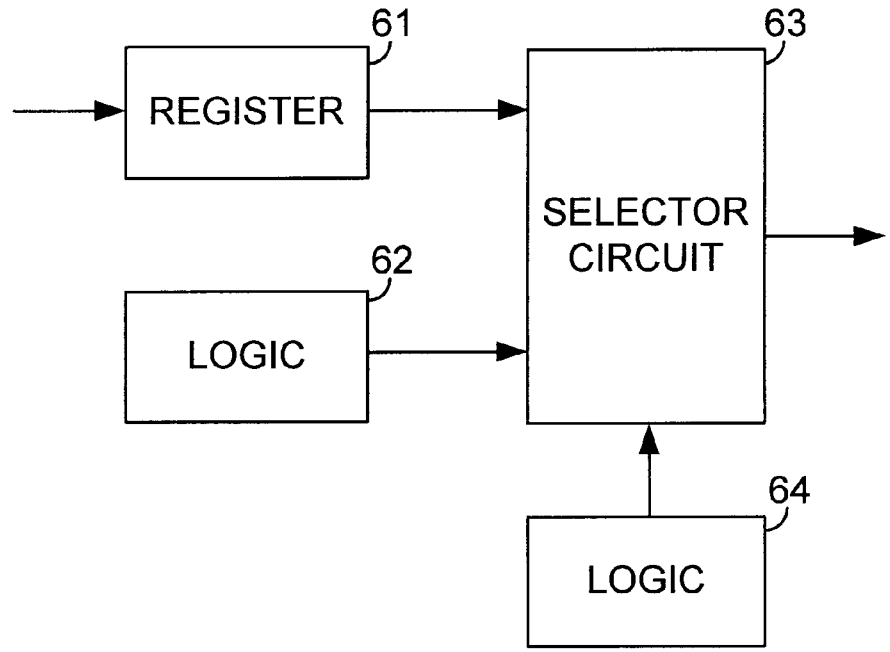
FIG. 6 shows a schematic block diagram of a mode signal source.

FIG. 6 shows a schematic representation of the mode signal source. As will be described in detail below, the integrated circuit may be tested with the input buffer in each mode of operation before a decision is made as to how to permanently fix the circuit before shipping to a customer. Also, the standby current of the device can be more accurately measured with the buffer in non-referenced mode.

The mode signal could be produced in many different ways, one example of which is shown in FIG. 6. The mode signal source comprises a register 61, logic circuits 62 and 64 and a selector circuit 63, connected together. To test the input buffer a test signal may be applied to an input of the register where it is subsequently stored. It is then coupled through the selector circuit 63 which outputs the signal as a logic high or a logic low corresponding to the voltage levels of the supply rails Vcc and Vss, respectively, as the mode signal (Vmode) to be applied to the gate of transistor 44 in FIG. 4. As explained above, the mode signal is selected according to the reference voltage applied to the reference branch of the input buffer circuit, to ensure satisfactory functioning of the input buffer circuit. Table 1 shown below, shows appropriate values for the mode signal and the reference voltage signal.

TABLE 1

| Mode of Operation of input buffer | Reference voltage signal REF2 | Mode signal |
| --- | --- | --- |
| Non-referenced input buffer | logic low | logic high |
| Voltage referenced input buffer | ANALOG LEVEL | logic low |

Test data is then fed into the integrated circuit and the set up and hold performance of circuit is determined. The input buffer may be electrically switched in each mode of operation by changing the value held by the register 61.

Figure 7:
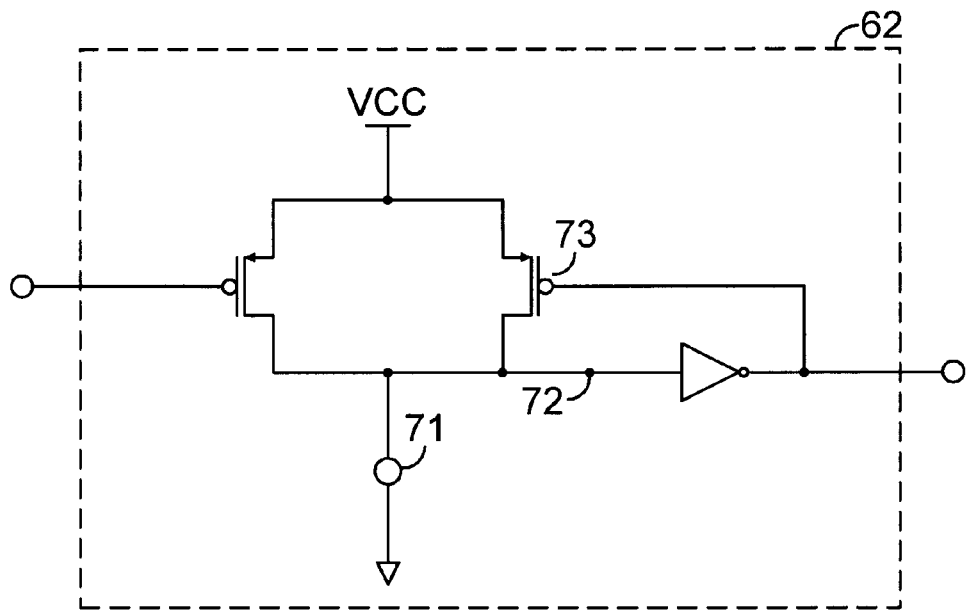
FIG. 7 shows a simplified circuit diagram of a logic circuit portion of the mode signal source.

FIG. 7 shows the logic circuit 62, which is the same design as logic circuit 64, which is used to fix the input buffer in the desired mode before it leaves the manufacturer.

Each logic circuit contains a fuse 71 which can be blown by a laser to form an open circuit. With the fuse intact, node 72 is fixed at Vss. With the fuse blown, node 72 can rise to Vcc. This is forced by a power-on reset signal. The latch formed by PMOS transistor 73 then fixes node 72 to Vcc.

If the fuse 71 is blown in logic circuit 62, this will ensure the mode signal is maintained as logic high which facilitates the input buffer's operation as a non-voltage referenced input buffer, whereas if the fuse 71 remains intact, the mode signal will be maintained as logic low, thereby facilitating the input buffer's operation as a voltage referenced input buffer. Many types of fuse are suitable for this function. The fuse 71 may be a metal layer which is blowable by laser. Alternatively, it may be a transistor with a gate controlled by a memory. Indeed, any non-volatile memory element may be used. Once the decision is made as to which mode the circuit is to operate in, the fuse 71 in logic circuit 62 is either blown or left intact, as appropriate, thereby permanently fixing the mode of operation of the circuit.

The selector circuit 63 is controlled by logic circuit 64. By blowing the fuse in logic circuit 64 the selector circuit 63 can be switched to allow it to be pass data from logic circuit 62. This permanently fixes the test mode signal. With the fuse in logic circuit 64 left intact the selector circuit 63 selects data from the register 61. This mode is used during testing by the manufacturer.

I claim:

1. An input buffer selectively configurable in one of a first mode of operation or a second mode of operation in response to a mode signal, said input buffer comprising (i) an input branch including at least two pull-up transistors coupled together in parallel and (ii) a reference signal branch coupled to the input branch, wherein (i) said first mode of operation is configured to control a trip point of the input branch and (ii) said second mode of operation is configured to disable one or more of the pull-up transistors to reduce the drive strength of the input branch.

2. An input buffer according to claim 1, in which the input branch further comprises an isolation transistor which is connected in series with said one of the pull-up transistors and configured to isolate said one of the pull-up transistors from a voltage supply in response to said mode signal applied to the isolation transistor.

3. An input buffer according to claim 1, in which the at least two pull-up transistors of said input branch comprise N pull-up transistors, wherein in said second mode of operation the mode signal is operative to disable up to N−1 of the pull-up transistors to reduce the drive strength of the input branch, where N≧2.

4. An input buffer according to claim 3, in which a number of the pull-up transistors are connected in parallel via a number of metal options.

5. An input buffer according to claim 3, in which the input branch further comprises N−1 isolation transistors each of which is connected in series with a respective one of said pull-up transistors and configured to isolate said pull-up transistors from a voltage supply in response to said mode signal applied to said isolation transistors.

6. A semiconductor device comprising an input buffer according to claim 1.

7. A semiconductor device according to claim 6, in which the input branch further comprises an isolation transistor which is connected in series with said one of the pull-up transistors and configured to isolate said one of the pull-up transistors from a voltage supply in response to said mode signal applied to the isolation transistor.

8. A semiconductor device according to claim 6, in which the at least two pull-up transistors of said input branch comprise N pull-up transistors, wherein in said second mode of operation the mode signal is operative to disable up to N−1 of the pull-up transistors to reduce the drive strength of the input branch, where n≧2.

9. A semiconductor device according to claim 8, in which a number of the pull-up transistors are connected in parallel via a number of metal options.

10. A semiconductor device according to claim 8, in which the input branch further comprises n−1 isolation transistors each of which is connected in series with a respective one of said pull-up transistors and configured to isolate said pull-up transistors from a voltage supply in response to said mode signal applied to said isolation transistors.

11. A semiconductor device according to claim 6, in which in said first mode of operation, an output of the reference branch is at a reference voltage when the mode signal is at a first logic state.

12. A semiconductor device according to claim 6, in which the mode signal comprises a test data source, a mode signal source, and a circuit for selecting data from one of the test data source and the mode signal source.

13. A semiconductor device according to claim 12, in which the mode signal source comprises a first logic circuit having a first fuse which is configurable to determine the output of the mode signal source.

14. A semiconductor device according to claim 12, in which the test data source comprises a register.

15. A semiconductor device according to claim 12, further comprising a second logic circuit having a second fuse configured to fix the mode signal output of the selector circuit.

16. A method of determining an operational mode of an input buffer, comprising the steps of:

applying a mode signal and a reference signal to the input buffer to configure the input buffer in a first mode of operation;

testing the operation of the circuit to obtain a test result;

configuring the input buffer in one of at least two different operational modes in response to the test result; and applying a different mode signal and a different reference signal to the input buffer to configure the input buffer in a second mode of operation.

17. A method according to claim 16, in which in said first mode of operation the mode signal and said reference signal applied to the input buffer are operative to constrain the trip point of the input buffer, thereby defining a voltage referenced mode of operation.

18. A method according to claim 16, in which in said second mode of operation the mode signal and said reference signal applied to the input buffer are operative to reduce the drive strength of the input buffer, thereby defining a non-voltage referenced mode of operation.

19. A method according to claim 16, including the step of applying test data to a register to provide a variable mode signal source during circuit testing.

20. A method according to claim 16, further comprising the step of blowing one or more fuses to set the mode signal and thereby fix the mode of operation of the input buffer.

21. A method according to claim 20, in which the step of blowing one or more fuses also sets the reference signal.

\* \* \* \* \*